United States Patent
Batra

(10) Patent No.: US 9,436,432 B2
(45) Date of Patent: Sep. 6, 2016

(54) FIRST-IN FIRST-OUT (FIFO) MEMORY WITH MULTI-PORT FUNCTIONALITY

(75) Inventor: Kapil Batra, Noida (IN)

(73) Assignee: STMICROELECTRONICS INTERNATIONAL N.V., Amsterdam (NL)

(*) Notice: Subject to any disclaimer, the term of this patent is extended or adjusted under 35 U.S.C. 154(b) by 935 days.

(21) Appl. No.: 11/648,113

(22) Filed: Dec. 29, 2006

(65) Prior Publication Data

US 2007/0183241 A1    Aug. 9, 2007

(30) Foreign Application Priority Data

Dec. 30, 2005   (IN) .......................... 3540/DEL/2005

(51) Int. Cl.
 *G06F 5/06*  (2006.01)
 *G06F 5/16*  (2006.01)
 *G11C 7/10*  (2006.01)

(52) U.S. Cl.
 CPC ............. *G06F 5/065* (2013.01); *G06F 5/16* (2013.01); *G11C 7/1075* (2013.01)

(58) Field of Classification Search
 CPC .............................. G06F 5/16; G11C 7/1075
 See application file for complete search history.

(56) References Cited

U.S. PATENT DOCUMENTS

| | | | | |
|---|---|---|---|---|
| 5,224,093 A * | 6/1993 | Denzel et al. | ................ | 370/417 |
| 5,262,996 A * | 11/1993 | Shiue | ............................ | 365/221 |
| 5,546,347 A * | 8/1996 | Ko et al. | ........................ | 365/221 |
| 6,526,495 B1 * | 2/2003 | Sevalia et al. | ................ | 711/173 |
| 6,779,061 B1 * | 8/2004 | Swindle et al. | ................ | 710/71 |
| 6,948,030 B1 * | 9/2005 | Gupta et al. | .................. | 711/109 |
| 7,149,139 B1 * | 12/2006 | Rosen | ............................ | 365/221 |
| 7,181,563 B2 * | 2/2007 | Andreev et al. | .................. | 711/5 |

\* cited by examiner

*Primary Examiner* — Gary W Cygiel
(74) *Attorney, Agent, or Firm* — Allen, Dyer, Doppelt, Milbrath & Gilchrist, P.A.

(57) ABSTRACT

A memory may require a buffering mechanism in which data can be written and read at the same time. This requires a multi-port FIFO memory, which has multiple ports, thus providing simultaneous read & write operations. Multi-port memories have a large penalty on area. Hence, a technique is proposed for avoiding use of multi-port memories for designs which requires sequential read and write operations. In this technique multiple single-port memories are used to form a multi-port memory. This memory requires additional control logic but consumes significantly lower silicon area.

18 Claims, 2 Drawing Sheets

FIRST-IN FIRST-OUT (FIFO) MEMORY WITH MULTI-PORT FUNCTIONALITY

CROSS-REFERENCE TO RELATED APPLICATIONS

The present application is related to Indian Patent Application No. 3540/Del/2005, filed Dec. 30, 2005, entitled "A FIRST-IN FIRST-OUT (FIFO) MEMORY PROVIDING MULTI-PORT FUNCTIONALITY". Indian Patent Application No. 3540/Del/2005 is assigned to the assignee of the present application and is hereby incorporated by reference into the present disclosure as if fully set forth herein. The present application hereby claims priority under 35 U.S.C. §119(a) to Indian Patent Application No. 3540/Del/2005.

TECHNICAL FIELD

The present disclosure relates to a first-in first-out (FIFO) memory providing multi-port functionality using single-port memory structures.

BACKGROUND

First-in first-out (FIFO) memories are commonly used in electronics system and VLSI circuits. For instance, a FIFO memory can be used as a buffer between two circuits for asynchronous operations. In these cases, data may be written and read out simultaneously from FIFO memories with Input/Output ports operating at different frequency. In such devices, data could not be received and written in a single clock cycle. To overcome the drawbacks of single-port memories, a dual-port FIFO was developed. However, typical dual-port memories result in large penalty in terms of area, almost double that of a single-port memory of same dimensions. Moreover, dual-port FIFO memories can only be used for a single simultaneous read and write operation.

To overcome this problem FIFO memories with multi-port functionality are being developed. Conventional multi-port FIFO memories provide functionality wherein multiple write operations and a single read operation may be performed in first-in first-out mode. As with dual-port memory, the size of the multi-port memory with same dimensions is much bigger in comparison to the single-port or dual-port memories.

There is therefore a need for a FIFO memory which may provide multi-port functionality using single-port memories.

SUMMARY

The present disclosure provides a first-in first-out (FIFO) memory providing multi-port functionality using single-port memory structures that occupies a reduced area.

In one embodiment, the present disclosure provides a first-in first-out (FIFO) memory providing multi-port functionality. The FIFO memory includes a plurality of said single-port memory structures. The FIFO memory also includes an indexing block to store information corresponding to incoming data for each data write operation in the single-port memory structure. The FIFO memory further includes an access controller to control operations in the single-port memory structures based on the contents of the indexing block.

In another embodiment, the present disclosure provides a method of operating a plurality of single port memory structures as a multi-port memory for sequential memory operations. The method includes maintaining a unique identifier corresponding to each said single port memory structure. The method also includes performing a "read operation active" check to find which of the single port memory structures is free for a data write operation. The method further includes storing the unique identifier corresponding to the single port memory in which the data write operation is done in an indexing block. The method still further includes performing data read operation based on the contents of said indexing block to ascertain the single port memory which has to be read.

In still another embodiment, the present disclosure provides a first-in first-out (FIFO) memory structure providing multi-port functionality. The FIFO memory includes a plurality of single-port memory structures. The FIFO memory also includes an access controller to maintain the pointer information for read and write operation in the plurality of single-port memory structures. The FIFO memory further includes an indexing block to store memory identifier corresponding to each of the single-port memory structures.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
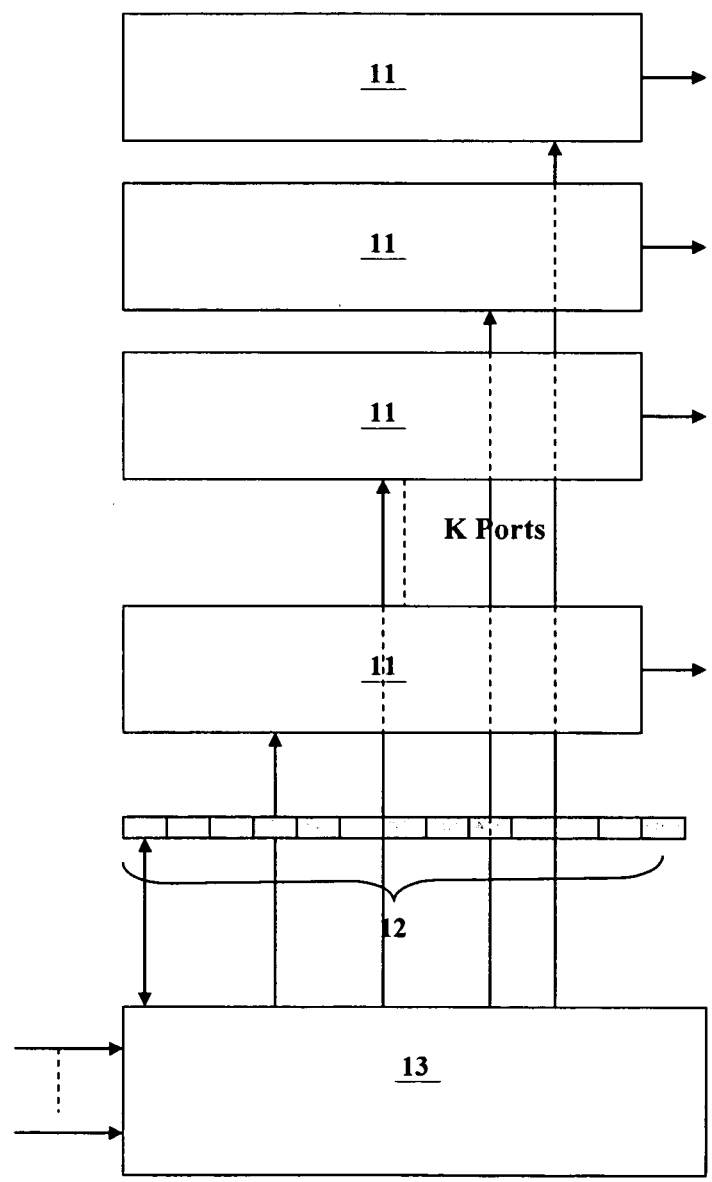
FIG. 1 is an exemplary block diagram for the multi-port memory according to one embodiment of the present disclosure.

A FIFO memory with multi-port functionality is described and the same is illustrated in FIG. 1. One embodiment of the present disclosure includes multiple single-port memories 11, an indexing block 12 and control logic namely an access controller 13.

One embodiment of the present disclosure relates to a FIFO memory architecture providing multi-port functionality and utilizes at least two single-port memories 11 to provide multi-port functionality and simultaneous sequential read and write operation capability. In one embodiment, the FIFO memory of the present disclosure requires less silicon chip area in comparison to other FIFO memories providing dual or multi-port functionality.

Multiple single-port memory structures 11 are coupled to an access controller 13 which maintains the pointer information for read and write operations in order for the architecture to act as a multi-port FIFO memory. The indexing block 12 stores memory identifier information corresponding to each single port memory structure. The number of bits in the indexing block 12 is dependent on number of FIFO memory locations as memory identifier information is required to be stored for each FIFO memory location. For instance, if K bits are required for storing the memory identifier information of single-port memories 11 and multi-port FIFO memory has N locations, the indexing block 12 has ability of storing K×N bits. During a write operation, the access controller 13 checks using "read operation active" check for availability of one of multiple single-port memories 11 for a write operation. Hence, at least one write operation is performed in available single-port memories 11.

Memory identifier information corresponding to the single-port memory 11 in which the data write operation is performed is stored in an indexing block 12. The write pointer for each single-port memory 11 is subsequently updated and maintained by the access controller 13. The access controller 13 also prioritizes write locations and accordingly updates the indexing block 12 in case of multiple write operations in a single clock cycle.

For a read operation, the access controller 13 in the FIFO memory checks the indexing block at the read pointer location for the FIFO memory architecture. A memory identifier stored in this location of the indexing block 12 is used to tell the single-port memory 11 where the desired data is stored. Access controller 13 is used to find a memory location within the selected single-port memory 11 and data is read from the location. While read operation is being performed, a "read operation active" flag is enabled in the access controller 13 to indicate unavailability of the selected memory 11 for a write operation. Hence, whenever there are simultaneous read and write operation requests on a same single-port memory 11, write operations would continue on the other available single-port memories.

Figure 2:
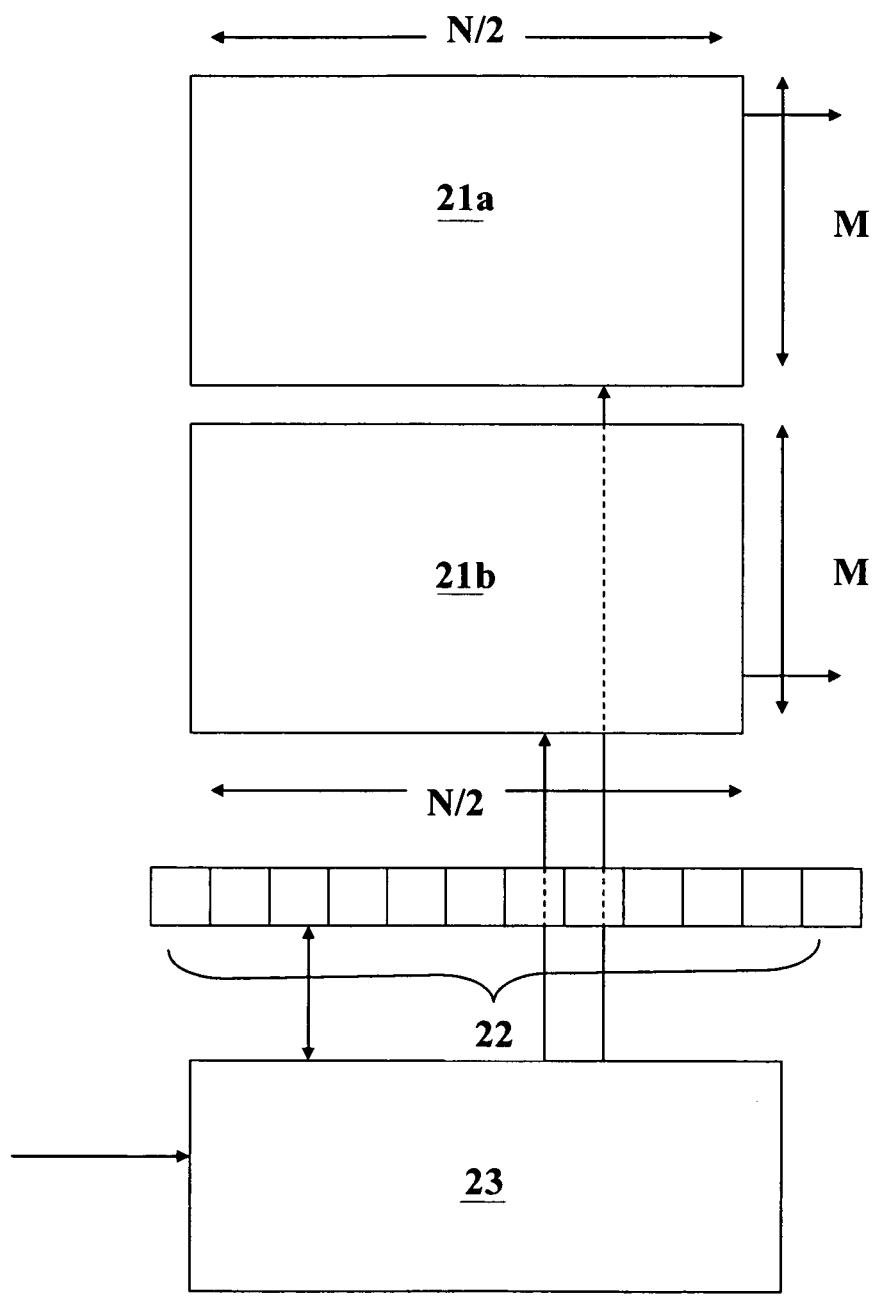
FIG. 2 is an exemplary block diagram for the dual-port memory according to one embodiment of the present disclosure.

According to one embodiment, a FIFO memory with dual-port functionality is described and the same is illustrated in FIG. 2. One embodiment of the present disclosure includes two single-port memories 21a and 21b, an indexing block 22 and control logic namely an access controller 23. To illustrate this, suppose a dual-port FIFO memory of size N (depth)×M (width) is required. One embodiment of the present disclosure uses two single-port memories (memory 21 and memory 0 & 1) of size N/2×M. An N×1 index 22 is maintained which can be implemented using flip-flops. Whenever a write occurs, index bit corresponding to write address (for the FIFO memory) is updated and it reflects the memory (0 or 1) in which the write has been done. A gray index depicts a write in memory 121a and a blank indicates memory 0 21b.

When a read occurs (valid read enable), the bit in indexing block 22 corresponding to read address, is decoded by the access controller 23 to select the appropriate memory (memories 21a or 21b). Before every write, a "busy due to ongoing read" check is done on the memory (e.g., memory 21a) which is currently required for write operations, and if busy with read operation, further write operations are diverted to other memory 21b available. So whenever there are simultaneous read and write operation requests, write operations would continue on the other available memory (i.e., memory select for write will toggle).

It is understood that FIG. 2 is intended as an example of a FIFO memory in accordance with one embodiment of the present disclosure and not as an architectural limitation. Those of ordinary skill in the art will appreciate that various combinations and arrangements may be employed without departing from the scope of the present disclosure.

According to another embodiment, single-port FIFO memories may be used in the architecture to further reduce the complexity of the access controller and the single-port memories used. According to yet another embodiment, the write operation may be alternated between multiple memories when there is no read operation in progress. This would result in almost same number of used locations in all single-port memories. The FIFO memory architecture of an embodiment of the present disclosure requires less area as only single port memories are used as against dual port memories which have significantly larger area.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A first-in first-out (FIFO) memory providing multi-port functionality, the FIFO memory comprising:
   a plurality of single-port memory structures, each single port memory structure having a plurality of addresses to read and write data thereto;
   an indexing block configured to store, for each data write operation, a unique memory identifier corresponding to a single-port memory structure in which the data write operation is performed; and
   an access controller configured to control operations in the single-port memory structures based on contents of the indexing block,
   wherein the access controller is configured to perform a plurality of write operations to the plurality of single-port memory structures in a single clock cycle,
   and
   wherein the access controller is further configured to continue at least one write operation of the plurality of write operations in the single clock cycle to a write address of a different single port memory structure of the plurality of single-port memory structures during the single clock cycle whenever there is a read and write operation request at a same time on one of the plurality of single-port memory structures.

2. The FIFO memory according to claim 1, wherein the access controller, during a write operation, is configured to perform a "read operation active" check to find a free one of the plurality of single-port memory structures to perform the write operation.

3. The FIFO memory according to claim 1, wherein the access controller is configured to store memory information having a read and write pointer for each of the plurality of single-port memory structures and the indexing block.

4. The FIFO memory according to claim 1, wherein the indexing block further comprises:
   a plurality of flip-flops configured to store unique identification information corresponding to each of the plurality of single-port memory structures.

5. The FIFO memory according to claim 1, wherein the access controller is configured to alternate sequential write operations between the plurality of single-port memory structures.

6. The FIFO memory according to claim 1, wherein the access controller, during a read operation from a single-port memory structure, is configured to enable a "read operation active" flag to indicate unavailability of the single-port memory structure for a write operation.

7. The FIFO memory of claim 1, wherein the access controller is configured to:
perform a "busy due to ongoing read" check before every write on memory required for a write operation request.

8. The FIFO memory of claim 1, wherein the FIFO memory is configured to emulate a dual-port FIFO memory of size N×M with two single-port memory structures of size N/2×M.

9. A method of operating a plurality of single-port memory structures as a multi-port first-in first-out (FIFO) memory for sequential memory operations, each single-port memory structure having a plurality of addresses to read and write data thereto, the method comprising:
maintaining a unique identifier corresponding to each of the single-port memory structure;
for each of a plurality of data write operations to the FIFO memory in a single clock cycle:
performing a "read operation active" check to find which of the plurality of single-port memory structures is free for the data write operations, and
storing the unique identifier corresponding to the single-port memory structure in which a data write operation is done in an indexing block, wherein the indexing block stores K×N bits, where K bits are required for storing the unique identifier of a single-port memory structure and the multi-port FIFO memory has N locations;
performing data read operations at a same time sequential with the data write operations based on the contents of the indexing block to ascertain the single-port memory structure which has to be read, wherein during the read operation a "read operation active" flag is enabled to indicate unavailability of the single-port memory structure for the data write operation; and
continuing at least one data write operation of the plurality of data write operations in the single clock cycle to a write address of a different single-port memory structure of the plurality of single-port memory structures whenever there is a read and write operation request at a same time on one of the plurality of single-port memory structures during the single clock cycle.

10. The method according to claim 9, wherein the indexing block further comprising:
storing unique identification information corresponding to each of the plurality of single-port memory structures within a plurality of flip-flops.

11. The method according to claim 9 further comprising:
alternating the sequential write operations between the plurality of single-port memory structures.

12. The method according to claim 9, further comprising storing a read and write pointer for each of the plurality of single-port memory structures and the indexing block.

13. A first-in first-out (FIFO) memory structure providing multi-port functionality for a FIFO queue, the FIFO memory structure comprising:
a plurality of single-port memory structures, each single port memory structure having a plurality of addresses to read and write data thereto;
an access controller configured to maintain pointer information for read and write operations in the plurality of single-port memory structures; and
an indexing block configured to store a unique memory identifier corresponding to a single-port memory structure in which a data write operation is performed,
wherein the access controller is configured to perform a plurality of write operations to the plurality of single-port memory structures in a single clock cycle,
and
wherein the access controller is further configured to continue at least one write operation of the plurality of write operations in the single clock cycle to a write address of a different single port memory structure of the plurality of single-port memory structures during the single clock cycle whenever there is a read and write operation request at a same time on one of the plurality of single-port memory structures.

14. The FIFO memory according to claim 13, wherein the access controller, during a write operation, is configured to perform a "read operation active" check to find a free one of the plurality of single-port memory structures to perform the write operation.

15. The FIFO memory according to claim 13, wherein the access controller is configured to store memory information comprising a read and write pointer for each of the plurality of single-port memory structures and the indexing block.

16. The FIFO memory according to claim 13, wherein the indexing block further comprises:
a plurality of flip-flops configured to store the unique memory identifier corresponding to each of the plurality of single-port memory structures.

17. The FIFO memory according to claim 13, wherein sequential write operations are alternated between the plurality of single-port memory structures.

18. The FIFO memory according to claim 13, wherein the access controller, during a read operation from a single-port memory structure, is configured to enable a "read operation active" flag to indicate unavailability of the single-port memory structure for a write operation.

* * * * *